(12) United States Patent
Jeon et al.

(10) Patent No.: US 6,274,931 B1
(45) Date of Patent: Aug. 14, 2001

(54) INTEGRATED CIRCUIT PACKAGING SYSTEMS AND METHODS THAT USE THE SAME PACKAGING SUBSTRATES FOR INTEGRATED CIRCUITS OF DIFFERENT DATA PATH WIDTHS

(75) Inventors: Jun-Young Jeon, Seoul; Jong-Hyun Choi, Kyunggi-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/395,649

(22) Filed: Sep. 14, 1999

(30) Foreign Application Priority Data

Sep. 18, 1998 (KR) .................................. 98-38788

(51) Int. Cl.[7] ........................... H01L 23/48; H01L 21/44; H01L 21/82

(52) U.S. Cl. ......................... 257/734; 257/723; 257/724; 257/773; 438/106; 438/110; 438/130

(58) Field of Search .................................. 257/734, 678, 257/684, 690, 692, 693, 697, 723, 773, 724, 775, 529; 438/132, 106, 110, 130

(56) References Cited

U.S. PATENT DOCUMENTS

| 5,536,909 | 7/1996 | DiStefano et al. ................... 174/261 |
| 5,896,395 | 4/1999 | Lee ....................................... 371/21.1 |

*Primary Examiner*—Matthew Smith
*Assistant Examiner*—Lex H. Malsawma
(74) *Attorney, Agent, or Firm*—Myers Bigel Sibley & Sajovec (57) ABSTRACT

Integrated circuit packages include an integrated circuit substrate having microelectronic devices therein and pads, wherein first ones of the pads are enabled to provide output data from the microelectronic devices, and wherein second ones of the pads are disabled to provide a reduced path width for the integrated circuit substrate. A packaging substrate includes terminals, a respective one of which is connected to a respective one of the pads, including the second ones of pads that are disabled to provide a reduced path width for the integrated circuit substrate. Accordingly, the same packaging substrates may be used with integrated circuit substrates having different path widths. In a preferred embodiment, the integrated circuit substrate includes a control circuit that disables the second ones of the pads to provide a reduced path width for the integrated circuit substrate. The control circuit preferably includes at least one fuse that disables the second ones of pads to provide the reduced path width for the integrated circuit substrate.

23 Claims, 7 Drawing Sheets

INTEGRATED CIRCUIT PACKAGING SYSTEMS AND METHODS THAT USE THE SAME PACKAGING SUBSTRATES FOR INTEGRATED CIRCUITS OF DIFFERENT DATA PATH WIDTHS

FIELD OF THE INVENTION

This invention relates to integrated circuit devices, and more particularly to systems and methods for packaging integrated circuit devices.

BACKGROUND OF THE INVENTION

Integrated circuits are widely used in consumer and commercial applications. As the integration density of integrated circuits continues to increase, it may be generally desirable to provide packaging systems and methods for integrated circuit substrates that can provide high density packaging in small volumes. Accordingly, many packaging substrates have been proposed for packaging highly integrated substrates. One such packaging substrate uses a ball grid array, as described in U.S. Pat. No. 5,536,909 to DiStefano et al. entitled Semiconductor Connection Components and Methods With Releasable Lead Support, the disclosure of which is hereby incorporated herein by reference.

In ball grid array technology, a lead frame and package balls are formed in a substrate base film. The substrate base film is then placed adjacent an integrated circuit to be packaged. The substrate base film is then bonded to the integrated circuit.

Figure 1:
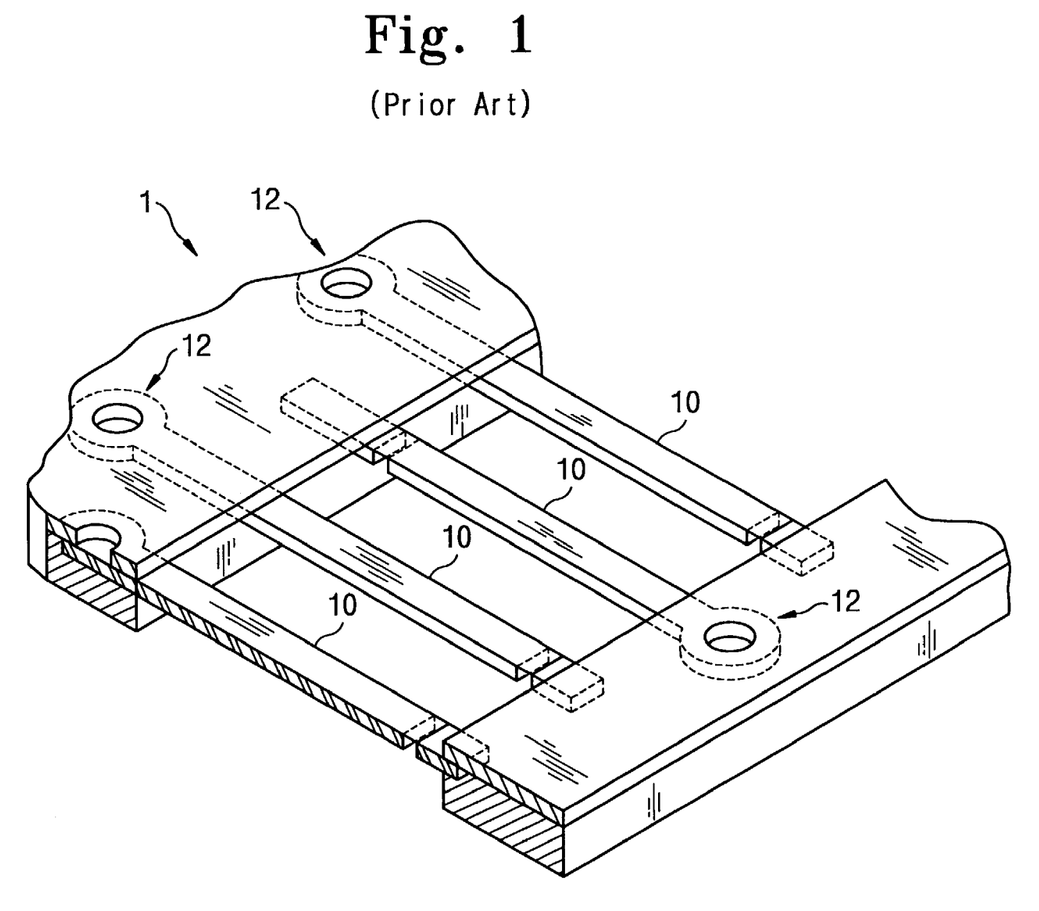
FIG. 1 is a perspective view of a conventional packaging substrate.
Figure 2:
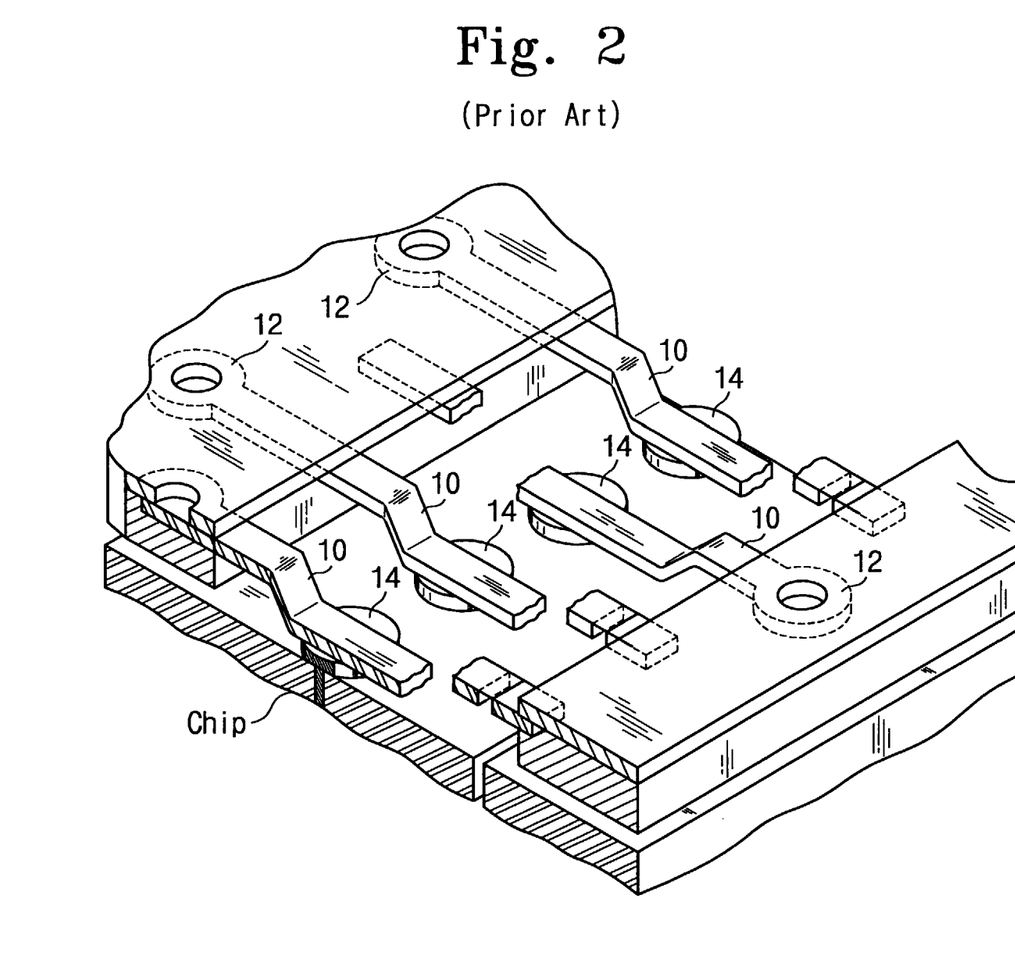
FIG. 2 is a perspective view of an integrated circuit substrate that is connected to a conventional packaging substrate.

FIG. 1 is a perspective view of a portion of a substrate base film as described in the above-cited DiStefano et al. patent. As shown in FIGS. 1 and 2, lead frames 10 of the substrate base film 1, corresponding to wires of a plastic package, are electrically connected to corresponding pads 14 on an integrated circuit device, labeled "Chip" in FIG. 2. The number of pads on the integrated circuit device generally corresponds to the number of the lead frames of the substrate base film 1. The pads, also referred to as input/output pads, provide output from and receive input to the integrated circuit including data input and output, control input and output, and/or address input and output. The design and fabrication of packaging substrates such as ball grid arrays are well known to those having skill in the art and need not be described further herein.

As is also known to those having skill in the art, integrated circuits may have varying path widths. For example, integrated circuit memory devices typically include an array of memory cells which has a selectable path width. The path width, which reflects the number of input/output channels, also referred to as "DQ" channels, can vary for a given size of memory. Thus, for example, a 16 megabit dynamic RAM (DRAM) array may be configured during manufacture to operate with a 4 bit path width, so that a 4 megabit by 4 DRAM is provided. Alternatively, the 16 megabit DRAM may be configured to operate as a 1 megabit by 16 DRAM, so that a 16 bit wide path is provided.

In one illustrative example, Samsung Electronics Co., Ltd., the assignee of the present invention, markets a family of 16 megabit CMOS DRAMs, as 4 megabit by 4 bit DRAMs and 1 megabit by 16 bit DRAMs. In particular, Model Nos. KM44C4004A, KM44C04104A, KM44V004A and KM44V4104A are marketed as 4 megabit by 4 bit DRAMs. See Samsung Electronics 1995 Databook, Pages 46–47. Models KM416C1004A, KM416C1204A, KM416V1004A and KM416V1204A are marketed as 1 megabit by 16 bit CMOS DRAMs. See Pages 62–63 of the aforesaid 1995 Databook. An integrated circuit memory in which 16 bits of data is simultaneously read from and written to a memory device via 16 DQ channels is referred to as operating in "x16" mode. Similarly, an integrated circuit memory device in which 4 data bits are simultaneously read from and written to a memory device via 4 DQ channels is referred to as operating in "x4" mode.

Integrated circuit memory devices may be designed and manufactured to include both the x16 and the x4 mode in a single integrated circuit. During manufacturing, either x16 mode or x4 mode is selected to produce, for example, a 4 megabit by 4 bit DRAM or a 1 megabit by 16 bit DRAM. Selection of the mode is generally performed by generating permanent selection signals during manufacturing. In particular, an x16 bonding pad and an x4 bonding pad are provided in the integrated circuit. One of the bonding pads is tied to ground or power supply voltage to permanently produce either an x16 or an x4 signal. Integrated circuit memory devices with varying path width are described in U.S. Pat. No. 5,896,395 to Lee entitled Integrated Circuit Memory Devices and Operating Methods Including Temporary Data Path Width Override, assigned to the assignee of the present invention, the disclosure of which is hereby incorporated herein by reference.

When an integrated circuit device has a reduced path width, some of the pads corresponding to the larger path width generally are not used. Moreover, when packaging these devices, lead frames 10 of the substrate base film corresponding to the unused pads generally are not formed on the substrate base film 1.

Notwithstanding these and other advances, it continues to be desirable to provide integrated circuit packages and packaging methods that can accommodate varying path widths, that can provide high density packages, and that can allow simplified manufacturing.

SUMMARY OF THE INVENTION

It is therefore an object of the present invention to provide integrated circuit packages that can be used with integrated circuit devices having reduced path width.

It is another object of the present invention to provide integrated circuit devices that can be packaged efficiently.

These and other objects may be provided, according to the present invention, by integrated circuit packages that include an integrated circuit substrate including a plurality of microelectronic devices therein and a plurality of pads, wherein first ones of the pads are enabled to provide output data from the microelectronic devices, and wherein second ones of the pads are disabled to provide a reduced path width for the integrated circuit substrate. A packaging substrate includes a plurality of terminals, a respective one of which is connected to a respective one of the pads, including the second ones of the plurality of pads that are disabled to provide a reduced path width for the integrated circuit substrate. Accordingly, the same packaging substrates may be used with integrated circuit substrates having different path widths. Efficient packaging thereby may be provided.

In a preferred embodiment, an integrated circuit substrate includes a control circuit that disables the second ones of the pads to provide a reduced path width for the integrated circuit substrate. The control circuit preferably includes at least one fuse that disables the second ones of pads to provide the reduced path width for the integrated circuit substrate.

The microelectronic devices may comprise a plurality of output circuits, a respective one of which is connected to a respective one of the pads, to provide output data external of the integrated circuit via the plurality of pads. A control circuit disables the output circuits that are connected to the second ones of the plurality of pads, to provide a reduced path width for the integrated circuit devices. The control circuit preferably comprises a pulse generator that generates a pulse from an external clock signal, and a fuse and a switch that are serially connected between first and second reference voltages. The switch is responsive to the pulse when the fuse is open, and the switch is disabled when the fuse is closed. The switch is connected to the output circuits that are connected to the second ones of the pads.

The present invention may be utilized with integrated circuits that include variable path widths. In particular, the present invention may be used with integrated circuit memory devices, including an array of memory cells that are connected to a plurality of output circuits, to provide output data from the array of memory cells to external of the integrated circuit memory device via a plurality of pads, wherein a control circuit disables selected ones of the output circuits to provide a reduced path width output for the integrated circuit memory device.

It also will be understood that the present invention can be used in connection with reduced input path width devices including reduced input and/or data path width and/or reduced input address path width. The packaging substrate preferably is a ball grid array packaging substrate. However, other packaging substrates also may be used. The present invention also can provide packaging methods that can efficiently package a plurality of integrated circuits other than integrated circuit memory devices, having variable path widths.

In particular, a plurality of integrated circuit substrates include a plurality of microelectronic devices therein and a plurality of first and second pads. The integrated circuit substrates comprise first integrated circuit substrates, wherein the first pads are enabled to provide output data from the microelectronic devices, and wherein the second pads are disabled to provide a reduced path width for the first integrated circuit devices. The integrated circuit substrates further comprise second integrated circuit substrates wherein the first and second pads are enabled, to provide output data from the microelectronic devices. The plurality of integrated circuit substrates including the first and second integrated circuit substrates are packaged by connecting a respective integrated circuit substrate to a respective one of a plurality of identical packaging substrates having a plurality of terminals. Accordingly, a respective terminal is connected to a respective one of the pads including the first and second pads, such that identical packaging substrates are used with the first and second integrated circuit substrates, notwithstanding that the second pads are disabled in the first integrated circuit substrates to provide a reduced path width for the first integrated circuit devices. Efficient packaging of integrated circuit devices such as integrated circuit memory devices thereby may be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present Also, when an element is referred to as being "connected" to another element, it can be directly connected to the other element or intervening elements may be present. In contrast, when an element is referred to as being "directly connected" to another element, there are no intervening elements present. Moreover, each embodiment described and illustrated herein includes its complementary conductivity type embodiment as well.

Figure 3:
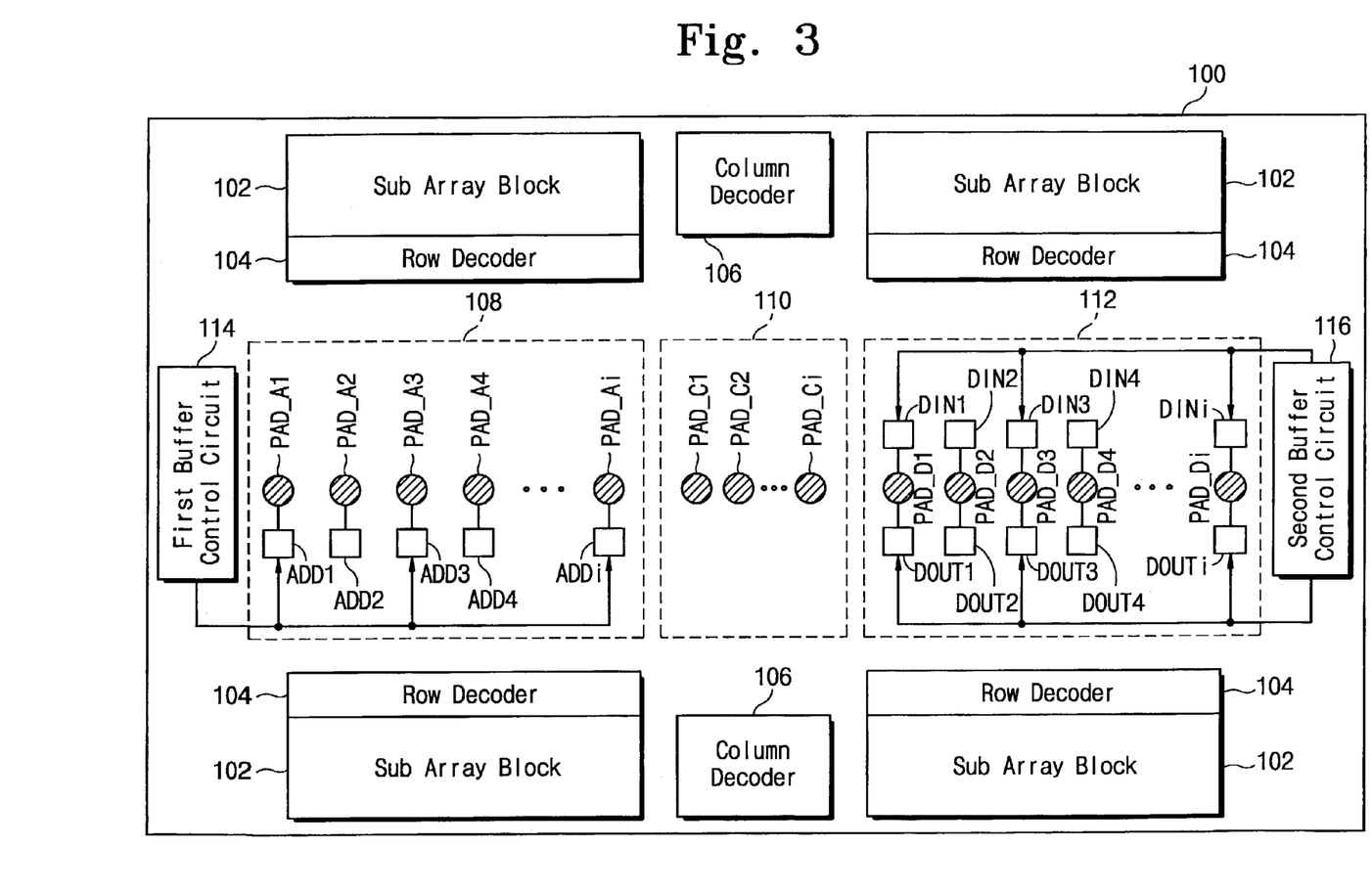
FIG. 3 is a block diagram of preferred embodiments of integrated circuit memory devices according to present invention.

FIG. 3 is a block diagram of embodiments of integrated circuit memory devices according to the present invention. In the memory device 100, four sub array blocks 102 are provided which store binary data information, respectively. A row decoder circuit 104 is connected to a respective sub array block 102, which selects the rows of a corresponding sub array block. Column decoder circuits 106 are arranged between pairs of sub array blocks 102, which select the columns of corresponding sub array blocks. The memory device 100 further comprises an address input section 108, a control signal input section 110, and a data input/output section 112, which are arranged at the center of the semiconductor memory device 100. It will be understood that other arrangements of integrated circuit memory devices also may be used, including some or all of the above-described elements.

The address input section 108 is comprised of a plurality of address pads PAD_A1 through PAD_Ai and a plurality of address input buffer circuits ADD1 through ADDi. The address pads PAD_A1 through PAD_Ai correspond to the address input buffer circuits ADD1 through ADDi, respectively. The control signal input section 110 receives various control signals in accordance with an operational mode of the memory device 100. For a DRAM device, the control signals may include a write enable signal, a row address strobe signal, a column address strobe signal, a chip select signal, a clock enable signal and a clock signal. Although not shown in FIG. 3, control signal input buffer circuits, corresponding respectively to the control pads PAD_C1 through PAD_Ci, may be provided in the control signal input section 110. The data input/output section 112 includes a plurality of data pads PAD_D1 through PAD_Di which are connected to corresponding data input buffer circuits DIN1 through DINi and corresponding data output buffer circuits DOUT1 through DOUTi, respectively.

It will be understood that address signals applied to the address input section 108, control signals applied to the control signal input section 110, and data provided to the data input/output section 112 may be provided to the row and the column decoder circuit and to internal control circuits. Also, data read out from the respective sub array blocks 102 may be transferred externally via the data output buffer circuits DOUT1 through DOUTi and the data pads PAD_D1 through PAD_Di. The design and operation of integrated circuit memory devices as described above are well known to those having skill in the art, and need not be described further herein.

An embodiment of a memory device 100 of the present invention further comprises a first buffer control circuit 114. The first buffer control circuit 114 is connected to selected ones of the address input buffer circuits ADD1 through ADDi, for example, ADD1, ADD3, and ADDi. The first buffer control circuit 114 enables and disables the address input buffer circuits ADD1, ADD3, and ADDi in accordance with a path width of the memory device 100. A preferred embodiment of the first buffer control circuit 114 and an address input buffer circuit ADD1 is illustrated in FIG. 4.

Figure 4:
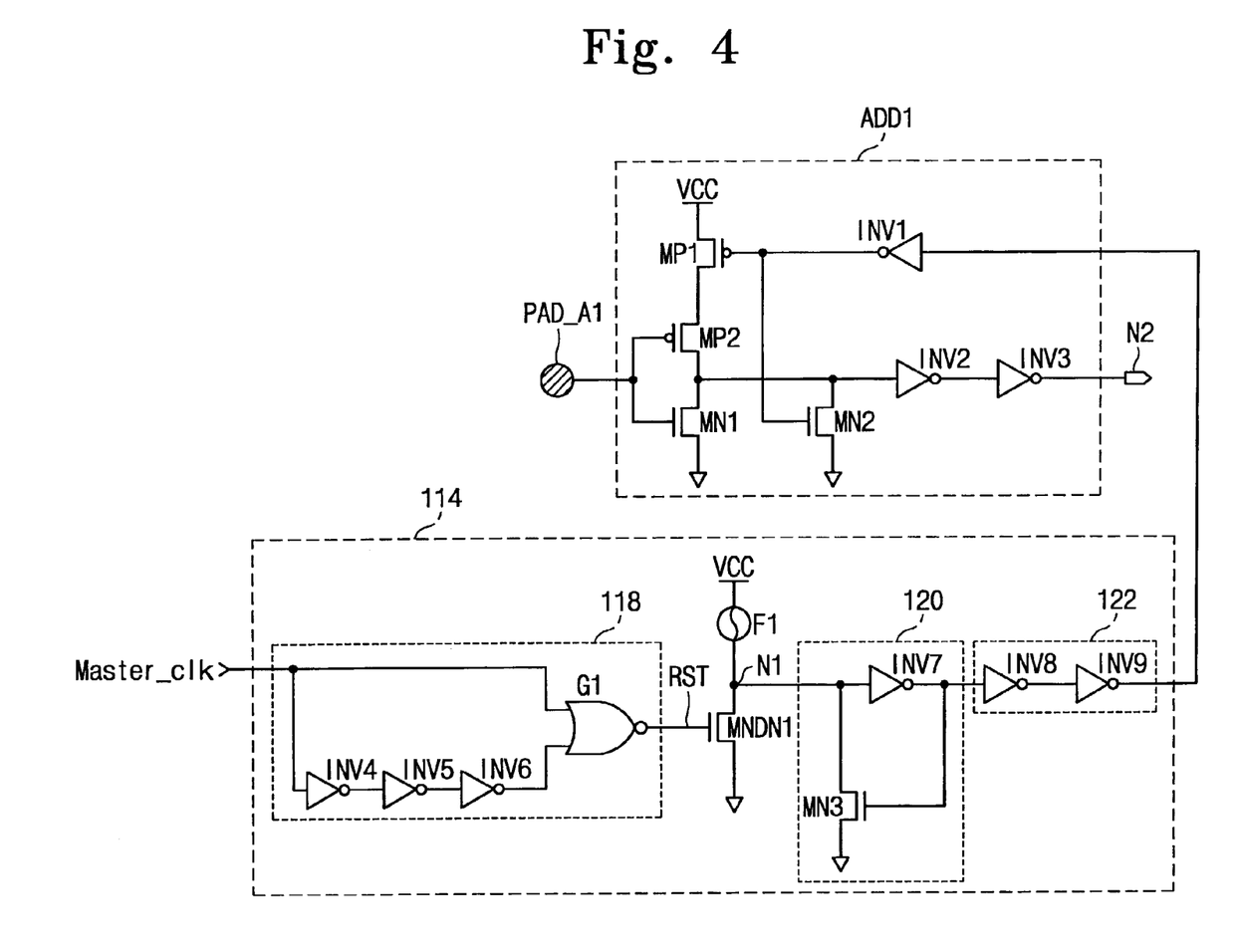
FIG. 4 is a circuit diagram of preferred embodiments of a first buffer control circuit and an address input buffer circuit of FIG. 3.

Referring to FIG. 4, the address input buffer circuit ADD1 is connected to a corresponding address pad PAD_A1, and is comprised of two PMOS transistors MP1 and MP2, two NMOS transistors MN1 and MN2, and three inverters INV1, INV2 and INV3 connected as illustrated in FIG. 4. Although only one address input buffer circuit ADD1 is illustrated in FIG. 4, other address input buffer circuits ADD3 and ADDi connected to the first buffer control circuit 114 may be configured similar to the address input buffer circuit ADD1 of FIG. 4.

The first buffer control circuit 114 is comprised of a pulse generator 118, a fuse F1, an NMOS transistor MNDN1, a latch circuit 120 and an output driver 122 having two series-connected inverters INV8 and INV9. The pulse generator 118 produces a signal RST of an active high pulse form in response to an externally applied master clock signal Master_clk. The pulse generator 118 comprises a chain of three series-connected inverters INV4, INV5 and INV6, and one NOR gate G1 which has an input terminal for receiving the signal Master_clk, the other input terminal for receiving the signal Master_clk via the chain, and an output terminal for outputting the signal RST. The fuse F1 is connected between a power supply voltage VCC and a node N1. The source and drain of the NMOS transistor MNDN1, the gate of which receives the signal RST, are connected between the node N1 and a ground voltage. Stated differently, the fuse F1 and the NMOS transistor MND1 are serially connected between first and second reference voltages. The inverter INV7 of the latch circuit 120 is coupled between the node N1 and the output driver 122, and the source and drain of the NMOS transistor MN3 are coupled between the node N1 and the ground voltage. The gate of MN3 is coupled to an output of the inverter INV7.

In operation, when the fuse F1 is closed (not cut), the node N1 becomes high via the fuse F1 at power-up. This forces the NMOS transistor MN2 of the buffer circuit ADD1 to be turned on and the PMOS transistor MP1 thereof to be turned off. In this condition, an address signal applied to the address pad PAD_A1 is not transferred to a node N2 and to the memory device 100. Thus, the address pad PAD_A1 is not connected to the address input buffer circuit ADD1. As a result, the node N2 for outputting an address signal continues to be maintained low regardless of the applied address signal.

When the fuse F1 is cut (open), the node N1 is grounded via the NMOS transistor MNDN1, which is turned on by the pulse signal RST of a logic high level that the pulse generator 118 generates in response to the master clock signal Master_clk. This turns off the NMOS transistor MN2 of the address input buffer circuit ADD1 and turns on the PMOS transistor MP1. Under this condition, when an address signal of, for example, a logic low level, is provided to the address pad PAD_A1, the PMOS transistor MP2 is turned on to thereby drive the node N2 to a logic high level. On the other hand, when an address signal of, for example, a logic high level, is provided to the address pad PAD_A1, the NMOS transistor MN1 is turned on to thereby drive the node N2 to a logic low level. Thus, the address input buffer circuit ADD1 operates normally. The operation of other address input buffer circuits connected to the first buffer control circuit 114 is similar to that above described, and need not be described again.

Referring again to FIG. 3, the memory device 100 further comprises a second buffer control circuit 116. The second buffer control circuit 116 is connected to selected ones of the data input and output buffer circuits DIN1 through DINi and DOUT1 through DOUTi for example, DIN1/DOUT1, DIN3/DOUT3, and DINi/DOUTi. The second buffer control circuit 116 enables and disables the data input and output buffer circuits DIN1/DOUT1, DIN3/DOUT3, and DINi/DOUTi in accordance with a path width of the memory device 100. A preferred embodiment of the second buffer control circuit 116 and data input and output buffer circuit DIN1 and DOUT1 is illustrated in FIG. 5.

Figure 5:
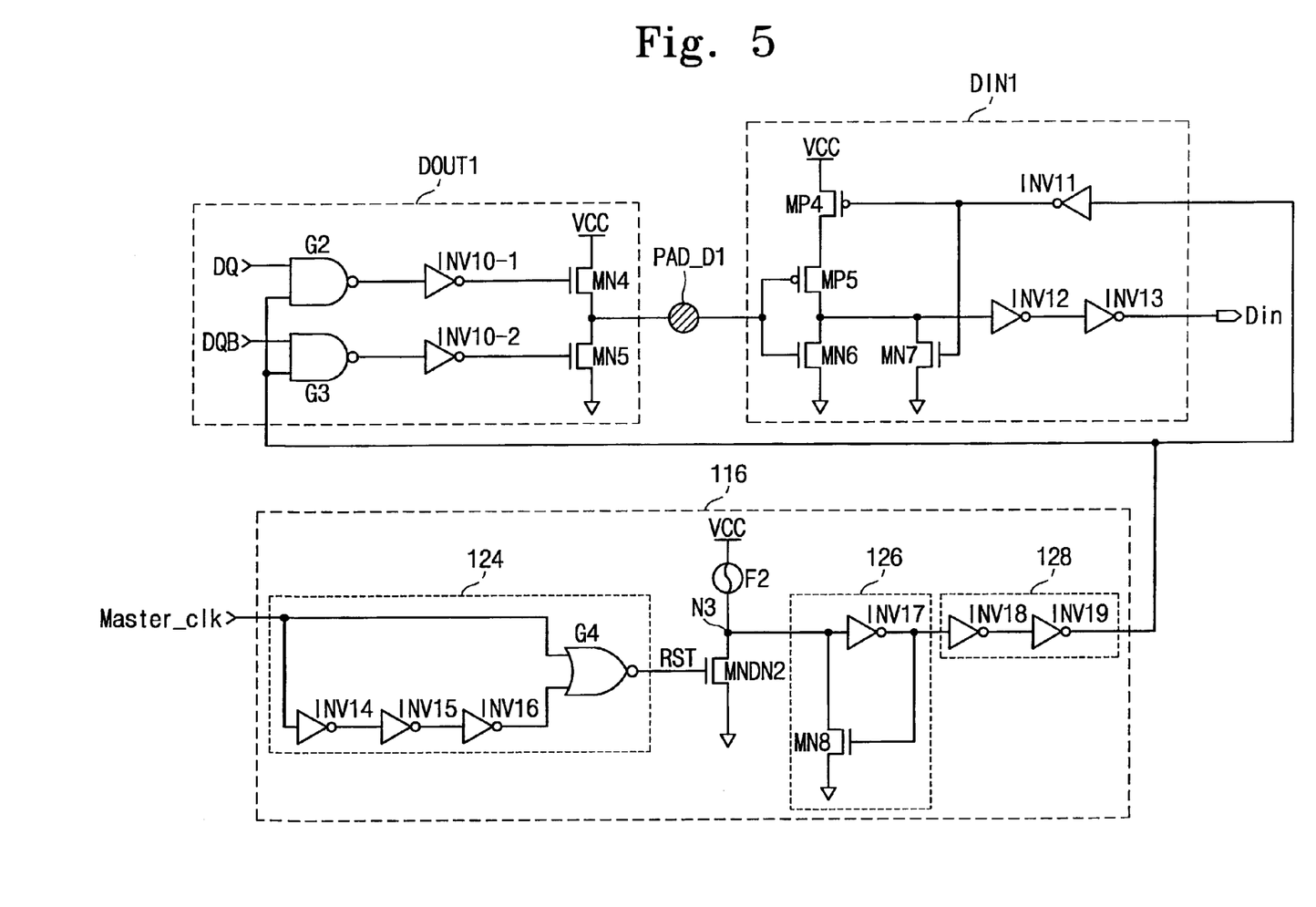
FIG. 5 is a circuit diagram of preferred embodiments of a second buffer control circuit in a data input/output buffer circuit of FIG. 3.

Referring to FIG. 5, the data input buffer circuit DIN1 is connected to a corresponding data pad PAD_D1, and is comprised of two PMOS transistors MP4 and MP5, two NMOS transistors MN6 and MN7, and three inverters INV11, INV12 and INV13 connected as illustrated in FIG. 5. The data output buffer circuit DOUT1 is connected to the data pad PAD_D1, and is comprised of two NAND gates G2 and G3, two inverters INV10-1, INV10-2, and two NMOS transistors MN4 and MN5 connected as shown in FIG. 5. The second buffer control circuit 116 is identical to that illustrated in FIG. 4, and need not be described again.

In operation, when the fuse F2 is closed (not cut), the node N3 is charged up to the power supply voltage via the fuse F2. This forces the NMOS transistor MN7 of the data input buffer circuit DIN1 to be turned on and the PMOS transistor MP4 thereof to be turned off. The NMOS transistors MN4 and MN5 of the data output buffer circuit DOUT1 are turned off by means of the second buffer control circuit 116. Thus, the data input and output buffer circuits DIN1 and DOUT1 are electrically disconnected from the data pad PAD_D1. Therefore, data is not input to or output from the memory device 100 via the data input and output buffer circuit DIN1 and DOUT1 during a write/read cycle.

When the fuse F2 is open (cut), the node N3 is grounded via the NMOS transistor MNDN2, which is turned on by the pulse signal RST of a logic high level that the pulse generator 124 generates in response to the master clock signal Master_clk. This turns off the NMOS transistor MN7 of the data input buffer circuit DIN1 and turns on the PMOS transistor MP4 thereof. Since input terminals of the NAND gates G2 and G3 connected to the second buffer control circuit 116 become high, respectively, outputs from the NAND gates G2 and G3 are determined in accordance with the data signals DQ and DQB which are applied to other input terminals of the gates G2 and G3, respectively.

Under this condition, data is output externally via the data output buffer circuit DOUT1 and the data pad PAD_D1 during a read cycle, and data is input to the memory device via the data pad PAD_D1 and the data input buffer circuit DIN1 during a write cycle. Thus, the data input and output buffer circuits DIN1 and DOUT1 operate normally. The operation of other data input and output buffer circuits connected to the second buffer control circuit 116 is identical to those described above, and need not be described again.

Figure 6:
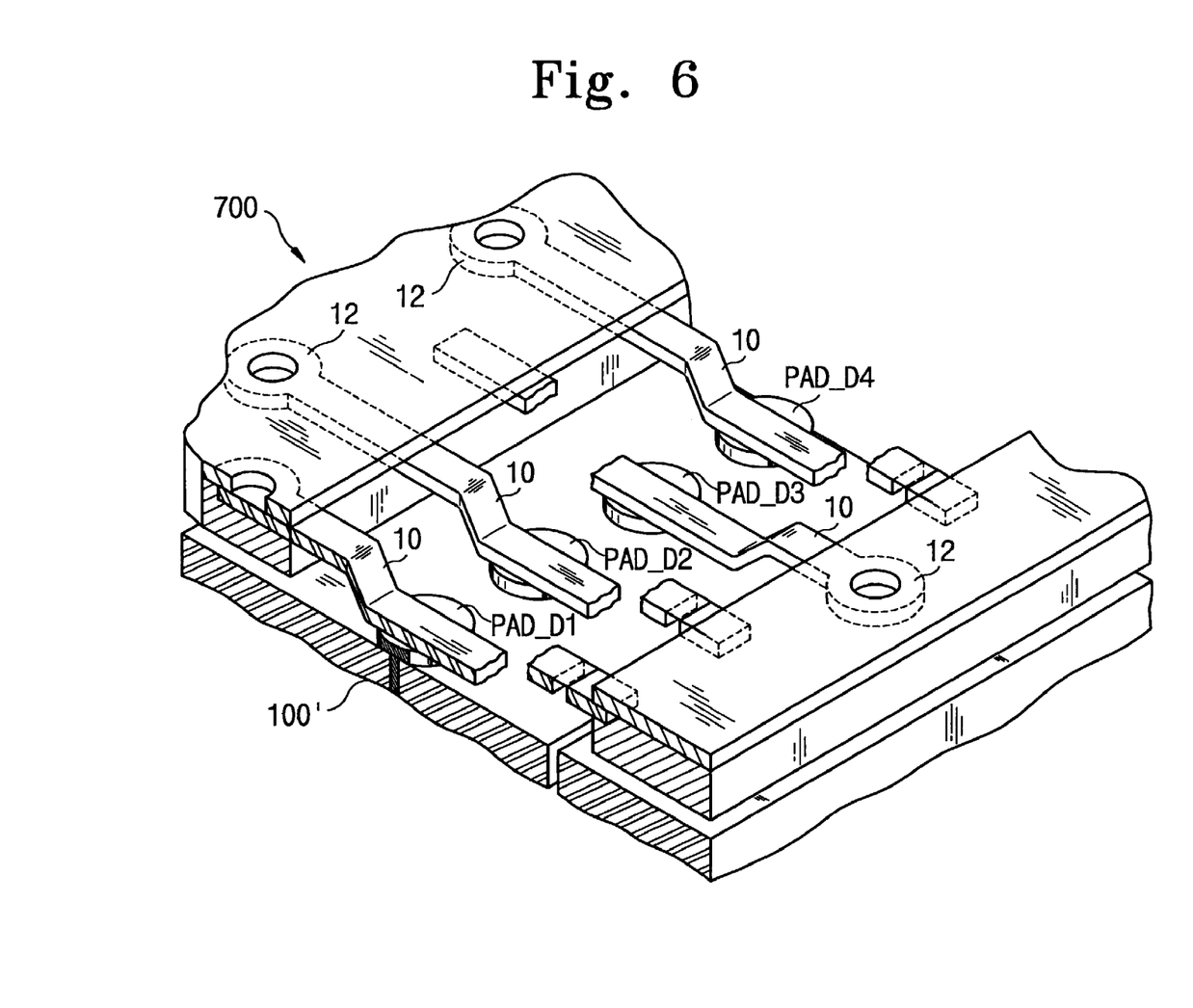
FIGS. 6 and 7 are perspective views of preferred embodiments of integrated circuit packages according to the present invention.
Figure 7:
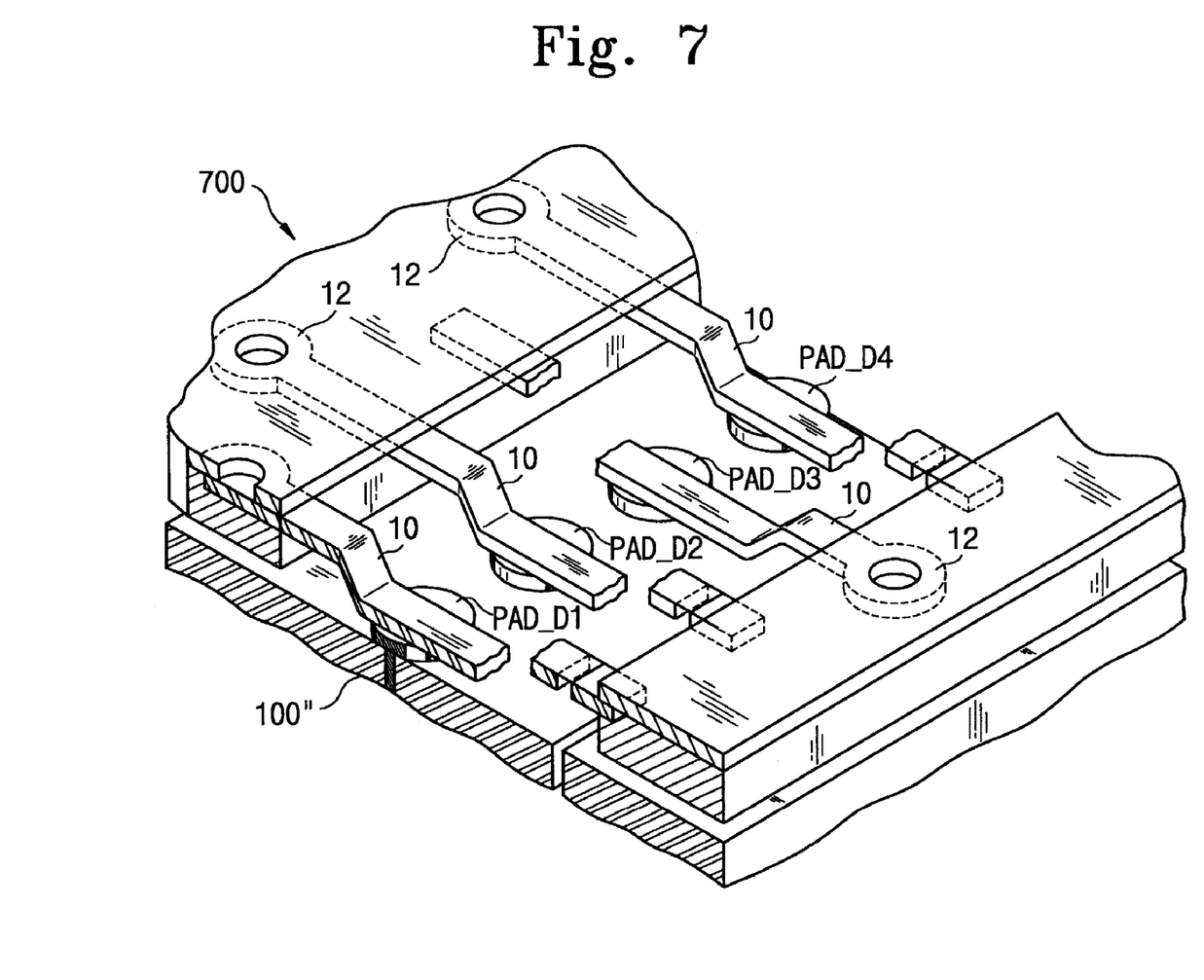

FIGS. 6 and 7 are perspective views of integrated circuit packages and packaging methods according to the invention, wherein identical packaging substrates are used with integrated circuit substrates having variable path widths. Assume that the memory device 100 of FIG. 3 is classified into two products: a first product 100' having x16 bit organization of FIG. 6 and a second product 100" x32 bit organization of FIG. 7. The number of the pads in the address input section 108 and the data input/output section 112 are determined in accordance with the x32 bit organization. In FIG. 6, where the memory device 100' has the x16 bit organization, the address pads PAD_A1, PAD_A3, and PAD_Ai, which are coupled respectively to the address input buffer circuits ADD1, ADD3 and ADDi that are controlled by the first buffer control circuit 114, are not used. Furthermore, the data pads PAD_D1, PAD_D3 and PAD_Di, which are connected respectively to the data input and output buffer circuits DIN1/DOUT1, DIN3/DOUT3, and DINi/DOUTi that are controlled by the second buffer control circuit 116, are not used.

Under this condition, in the conventional case described in FIGS. 1 and 2, two different packaging substrates 1 are separately formed so as to correspond to the x16 and x32 bit organizations, respectively. However, for the present invention, as shown in FIGS. 6 and 7, a single packaging substrate 700 can be used for all of the products 100' and 100" having the x16 bit organization and the x32 bit organization respectively.

In particular, in the memory device 100" having the x32 bit organization (FIG. 7), the lead frames 10 of the packaging substrate 700 which are formed depending on x32 bit organization are electrically bonded to corresponding address pads PAD_A1 through PAD_Ai, corresponding control pads PAD_C1 through PAD_Ci, and corresponding data pads PAD_D1 through PAD_Di. The fuses F1 and F2 in the first and second buffer control circuits 114 and 116 are cut. Therefore, the address input buffer circuits ADD1, ADD3 and ADDi connected to the first buffer control circuit 114 are connected respectively to the corresponding address pads PAD_A1, PAD_A3, and PAD_Ai, as described above. Similarly, the data input and output buffer circuits DIN1/DOUT1, DIN3/DOUT3, and DINi/DOUTi connected to the second buffer control circuit, are electrically connected respectively to the corresponding data pads PAD_D1, PAD_D3, and PAD_Di, as described above.

In the memory device 100' having the x16 bit organization (FIG. 6), the lead frames 10 of the substrate base film 1 which are fabricated in accordance with x32 bit organization are electrically bonded to corresponding address pads PAD_A1 through PAD_Ai, corresponding control pads PAD_C1 through PAD_Ci, and corresponding data pads PAD_D1 through PAD_Di. However, the fuses F1 and F2 in the first and second buffer control circuits 114 and 116 are not cut. Therefore, the address input buffer circuits ADD1, ADD3 and ADDi connected to the first buffer control circuit 114, are disconnected from the corresponding address pads PAD_A1, PAD_A3, and PAD_Ai, as described above. Similarly, the data input and output buffer circuits DIN1/DOUT1, DIN3/DOUT3, and DINi/DOUTi coupled to the second buffer control circuit, are disconnected from the corresponding data pads PAD_D1, PAD_D3, and PAD_Di, as described above.

Thus, only one type of packaging substrate 700, which can be formed based on a maximum path width, can be used in all products associated with the same memory device. As a result, multiple configurations of packaging substrates 700 need not be formed separately for packaging integrated circuits of varying path widths.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit package comprising:
   an integrated circuit substrate including a plurality of microelectronic devices therein and a plurality of pads, wherein first ones of the pads are enabled to provide output data from the microelectronic devices and wherein second ones of the pads are disabled to provide a reduced path width for the integrated circuit substrate; and
   a packaging substrate having a plurality of terminals, a respective one of which is connected to a respective one of the pads, including the second ones of the plurality of pads that are disabled to provide a reduced path width for the integrated circuit substrate.

2. An integrated circuit package according to claim 1 wherein the integrated circuit substrate further comprises:
   a control circuit that disables the second ones of the pads to provide a reduced path width for the integrated circuit substrate.

3. An integrated circuit package according to claim 2 wherein the control circuit includes at least one fuse that disables the second ones of the pads to provide a reduced path width for the integrated circuit substrate.

4. An integrated circuit package according to claim 1 wherein the integrated circuit is an integrated circuit memory device including an array of memory cells that are connected to the plurality of pads to provide output data from the array of memory cells to external of the integrated circuit memory device, wherein the first ones of the pads are enabled to provide output data from the array of memory cells and wherein the second ones of the pads are disabled to provide a reduced path width for the array of memory cells.

5. An integrated circuit package according to claim 1 wherein the packaging substrate is a ball grid array packaging substrate.

6. An integrated circuit package according to claim 1 wherein the microelectronic devices comprise:
   a plurality of output circuits, a respective one of which is connected to a respective one of the pads, to provide output data external of the integrated circuit via the plurality of pads; and
   a control circuit that disables the output circuits that are connected to the second ones of the plurality of pads to provide a reduced path width for the integrated circuit device.

7. An integrated circuit package according to claim 6 wherein the control circuit includes at least one fuse that disables the second ones of the output circuits to provide a reduced path width for the integrated circuit device.

8. An integrated circuit package according to claim 6 wherein the integrated circuit is an integrated circuit memory device including an array of memory cells that are connected to the plurality of output circuits to provide output data from the array of memory cells to external of the integrated circuit memory device via the plurality of pads, wherein the control circuit disables selected ones of the output circuits to provide a reduced path width for the integrated circuit memory device.

9. An integrated circuit package according to claim 6 wherein the packaging substrate is a ball grid array packaging substrate.

10. An integrated circuit package according to claim 6 further comprising:
   a plurality of input circuits, a respective one of which is connected to a respective one of the pads, to receive input data from external of the integrated circuit via the plurality of pads;
   wherein the control circuit disables the input circuits that are connected to the second ones of the plurality of pads to provide a reduced data path input for the integrated circuit device.

11. An integrated circuit package according to claim 10 wherein the input data comprises input addresses.

12. An integrated circuit package according to claim 6 wherein the control circuit comprises:
   a pulse generator that generates a pulse from an external clock signal;
   a fuse and a switch that are serially connected between first and second reference voltages, wherein the switch is responsive to the pulse when the fuse is open and wherein the switch is disabled when the fuse is closed, the switch being connected to the output circuits that are connected to the second ones of the plurality of pads.

13. A method of packaging a plurality of integrated circuit substrates including a plurality of microelectronic devices therein and a plurality of first and second pads, the integrated circuit substrates comprising first integrated circuit substrates wherein the first pads are enabled to provide output data from the microelectronic devices and wherein the second pads are disabled to provide a reduced path width for the first integrated circuit devices, the integrated circuit substrates further comprising second integrated circuit substrates wherein the first and second pads are enabled to provide output data from the microelectronic devices, the method comprising the step of:
   connecting a respective integrated circuit substrate to a respective one of a plurality of identical packaging substrates having a plurality of terminals, wherein a respective terminal is connected to a respective one of the pads including the first and second pads such that identical packaging substrates are used with the first and second integrated circuit substrates notwithstanding that the second pads are disabled in the first integrated circuit substrates to provide a reduced path width for the first integrated circuit devices.

14. A method according to claim 13 wherein the integrated circuit is an integrated circuit memory device, wherein the microelectronic devices comprise an array of memory cells that are connected to the plurality of first and second pads to provide output data from the array of memory cells to external of the integrated circuit memory device.

15. A method according to claim 13 wherein the identical packaging substrates are a plurality of identical ball grid array packaging substrates.

16. An integrated circuit comprising:
   a plurality of pads;
   a plurality of output circuits, a respective one of which is connected to a respective one of the pads, to provide output data external of the integrated circuit via the plurality of pads; and
   a control circuit that disables selected ones of the output circuits to provide a reduced path width for the integrated circuit device.

17. An integrated circuit according to claim 16 wherein the control circuit includes at least one fuse that disables the selected ones of the output circuits to provide a reduced path width for the integrated circuit device.

18. An integrated circuit according to claim 16 in combination with a packaging substrate having a plurality of terminals, a respective one of which is connected to a respective one of the pads, including to the pads that are connected to the selected ones of the output circuits.

19. An integrated circuit according to claim 18 wherein the packaging substrate is a ball grid array packaging substrate.

20. An integrated circuit according to claim 16:
   wherein the integrated circuit is an integrated circuit memory device including an array of memory cells that are connected to the plurality of output circuits to provide output data from the array of memory cells to external of the integrated circuit memory device via the plurality of pads; and
   wherein the control circuit disables selected ones of the output circuits to provide a reduced path width for the integrated circuit memory device.

21. An integrated circuit according to claim 16 further comprising:
   a plurality of input circuits, a respective one of which is connected to a respective one of the pads, to receive input data from external of the integrated circuit via the plurality of pads;
   wherein the control circuit disables selected ones of the input circuits to provide a reduced data path input for the integrated circuit device.

22. An integrated circuit according to claim 21 wherein the input data comprises input addresses.

23. An integrated circuit according to claim 16 wherein the control circuit comprises:
   a pulse generator that generates a pulse from an external clock signal;
   a fuse and a switch that are serially connected between first and second reference voltages, wherein the switch is responsive to the pulse when the fuse is open and wherein the switch is disabled when the fuse is closed, the switch being connected to the selected ones of the output circuits.

* * * * *